United States Patent
Richardson et al.

(10) Patent No.: US 6,478,452 B1
(45) Date of Patent: Nov. 12, 2002

(54) DIODE-LASER LINE-ILLUMINATING SYSTEM

(75) Inventors: Matthew O. Richardson, Colfax, CA (US); Haiyin Sun, Citrus Heights, CA (US); Christopher John Kruger, Auburn, CA (US)

(73) Assignee: Coherent, Inc., Santa Clara, CA (US)

(*) Notice: Subject to any disclaimer, the term of this patent is extended or adjusted under 35 U.S.C. 154(b) by 0 days.

(21) Appl. No.: 09/488,211

(22) Filed: Jan. 19, 2000

(51) Int. Cl.$^7$ .............................. F21V 5/00; G02B 13/08
(52) U.S. Cl. ..................... 362/268; 362/331; 362/332; 362/336; 372/43; 359/668; 359/641; 235/454
(58) Field of Search .................. 362/268, 326, 362/331, 332, 336, 337–340; 372/43, 101, 108; 359/668, 719, 741, 641; 235/454, 455, 462.2, 462.22, 462.23

(56) References Cited

U.S. PATENT DOCUMENTS

| | | | |
|---|---|---|---|
| 4,069,080 A | 1/1978 | Osborne ................. 156/272 |
| 4,253,735 A | * 3/1981 | Kawamura et al. ......... 359/668 |
| 4,564,268 A | * 1/1986 | Tatsuno et al. ............. 359/652 |
| 5,140,608 A | 8/1992 | Karpol et al. .............. 372/101 |
| 5,386,105 A | * 1/1995 | Quinn et al. ........... 235/462.22 |
| 5,465,178 A | 11/1995 | Nakai et al. ............... 359/670 |
| 5,495,096 A | * 2/1996 | Ogata et al. ........... 235/462.22 |
| 5,517,359 A | 5/1996 | Gelbart ...................... 359/623 |
| 5,521,748 A | 5/1996 | Sarraf ........................ 359/321 |
| 5,710,418 A | 1/1998 | Tawara ....................... 235/472 |
| 5,723,851 A | * 3/1998 | Salatto et al. .......... 235/462.22 |
| 5,790,576 A | * 8/1998 | Waarts et al. ................. 372/43 |
| 5,844,723 A | * 12/1998 | Snyder ....................... 359/668 |
| 5,963,577 A | * 10/1999 | Snyder et al. .............. 372/101 |
| 5,967,645 A | 10/1999 | Anderson ................... 362/259 |
| 6,052,236 A | * 4/2000 | Nakasuji et al. ............ 359/718 |
| 6,371,371 B1 | * 4/2002 | Reichenbach ............... 235/454 |

FOREIGN PATENT DOCUMENTS

| | | | |
|---|---|---|---|
| EP | 0 543 481 | 7/1992 | ............ G11B/7/09 |
| JP | 1-118813 | 5/1989 | ........... G02B/27/00 |

* cited by examiner

*Primary Examiner*—Sandra O'Shea
*Assistant Examiner*—David V. Hobden
(74) *Attorney, Agent, or Firm*—Stallman & Pollock LLP

(57) ABSTRACT

An illumination apparatus includes a semiconductor laser providing light-output in first and second mutually perpendicular axes. The light-output propagates in a direction mutually perpendicular to the first and second axes. An optical system is arranged cooperative with the semiconductor laser to focus the light-output inn the first and second axes at respectively first and second focal points spaced apart in the propagation direction. At a plane intersecting the first focal point perpendicular to the direction of propagation, the focussed diode-laser light-output is formed into a line of light having a width in the first axis and a length in the second axis.

9 Claims, 2 Drawing Sheets

DIODE-LASER LINE-ILLUMINATING SYSTEM

TECHNICAL FIELD OF THE INVENTION

The present invention relates in general to optical systems for shaping illumination from a diode-laser. The invention relates in particular to an optical system for projecting light from a diode-laser into a narrow line.

DISCUSSION OF BACKGROUND ART

Diode-lasers are commonly used as sources of illumination in various graphics applications such as display systems, optical printing systems and optical recording systems. For such applications many optical systems have been devised to optically shape the characteristic astigmatic light output of a diode-laser into a symmetrical anastigmatic form that can be focussed into an biaxially symmetrical spot or illuminating area. By way of example, a very small, uniform spot of light projected from a diode-laser can be used to record correspondingly small spots on a light sensitive medium. A plurality of small spots recorded over an area can be used to record a graphic image or pattern. A line of small spots in a particular sequence and spacing can be used to optically record data.

There are other applications for diode-laser illumination which would be possible if the diode-laser light could be projected into the form of a fine line having a width no greater than about 6.0 micrometers ($\mu$m). Such applications include laser microwelding and laser machine alignment.

SUMMARY OF THE INVENTION

In one aspect, the present invention is directed to providing an illumination apparatus for projecting the light-output of a semiconductor-laser into a fine line. The line preferably has a width less than about 6.0 $\mu$m. One preferred embodiment of the inventive apparatus includes a semiconductor-laser providing light output in first and second mutually perpendicular axes. The light-output propagates in a direction mutually perpendicular to the first and second axes. The inventive apparatus includes an optical system arranged cooperative with the semiconductor-laser to focus the light-output in the first and second axes at respectively first and second focal points spaced apart in the propagation direction. At a plane intersecting the first focal point perpendicular to the direction of propagation, the focused semiconductor-laser light-output is formed into a line of light having a width in the first axis and a length in the second axis.

Preferably the first focal point is closer to the optical system than the second focal point. The diode laser may be a semiconductor laser emitting light-output having a different divergence in characteristic fast and slow axes. The fast and slow axes correspond to above discussed first and second axes respectively. The semiconductor laser may be a vertical-cavity surface-emitting laser (VCSEL). Such a laser has an essentially symmetrical light-output, in which case the above-discussed first and second axes correspond to respectively Y and X axes of the optical system.

In one preferred embodiment, the optical system includes first, second and third lenses spaced apart in consecutive numerical order in the direction of propagation. The first and third lenses each have positive dioptric power in both the first and second axes. The second lens has zero dioptric power in the first axis and positive dioptric power in the second axis. The first lens is spaced apart from the semiconductor laser by a distance equal to about its focal length. The second lens is spaced apart from the third lens by a distance greater than the second-axis focal length. The third lens has a focal length greater than the focal length of the first lens, and the second lens has a second-axis focal length greater than the focal length of the third lens. The first focal point is closer to the optical system than the second focal point In one example of the inventive line-illumination system incorporating the above-exemplified optical system the semiconductor is a single-mode edge-emitting diode laser. A line of light having a width of about 3.0 $\mu$m is projected at a distance of about 0.23 inches from the optical system. The projected line of light has a length of about 170.0 $\mu$m. The first and second back-focal lengths of the optical system are about 0.23 and 0.80 inches respectively. The 3.0 $\mu$m linewidth and all other line-widths referred to herein are the widths measured at across the 1/e2 points of the lines.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the invention.

DETAILED DESCRIPTION OF THE INVENTION

Figure 1:
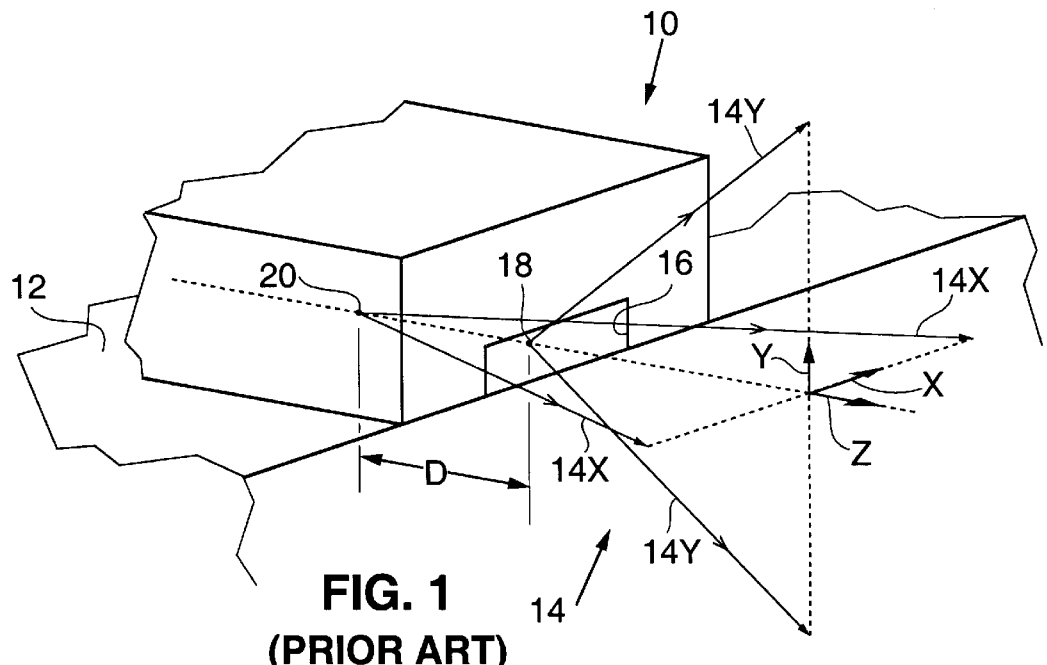
FIG. 1 schematically illustrates astigmatic light-output of an edge-emitting diode laser.

Turning now to the drawings, FIG. 1 schematically illustrates an example of light output from an edge-emitting diode laser 10. Diode-laser 10 is supported on a mount or heat sink 12. Diode-laser light-output is emitted as beam 14 from an output aperture 16. For diode-laser emitting at about 638 nanometers (nm), output aperture 16 has a height of about 1.0 micrometers ($\mu$m) and a width which may be between about 3.0 and 4.0 $\mu$m for a single-mode diode-laser and about 80 $\mu$m or more for a multimode diode-laser.

Beam 14 diverges in a slow (horizontal) axis X (see rays 14X), aligned with the width of aperture 16, at an included angle of about 8.0°, and diverges in a fast (vertical) axis Y (see rays 14Y), perpendicular to slow axis X, at an included angle of about 31.0°. Beam 14 propagates generally along an axis Z mutually perpendicular to the X and Y-axes. A result of the differing divergence is that beam 14 appears to originate in the fast axis at a point 18 in diode-laser 10 relatively close to output aperture 16 thereof, while in the slow axis appearing to originate at a point 20 further into diode-laser 10. The astigmatism of beam may be quantified as the distance D between points 18 and 20. Distance D may vary from about 6.0 $\mu$m for a single-mode diode-laser to about 50.0 $\mu$m for a multimode diode-laser.

Figure 2A:
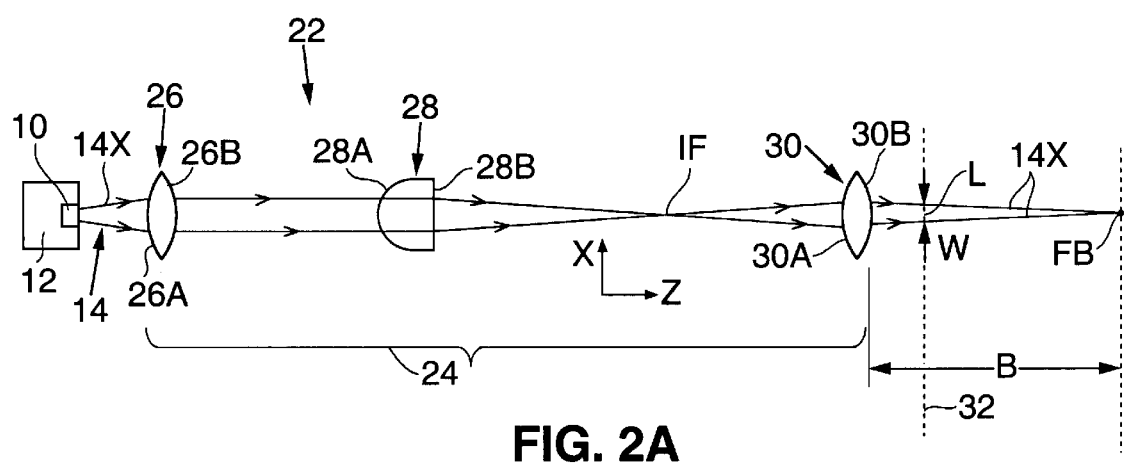
FIGS. 2A and 2B schematically illustrate a preferred embodiment of a diode-laser line-illuminating system in accordance with the present invention.
Figure 2B:
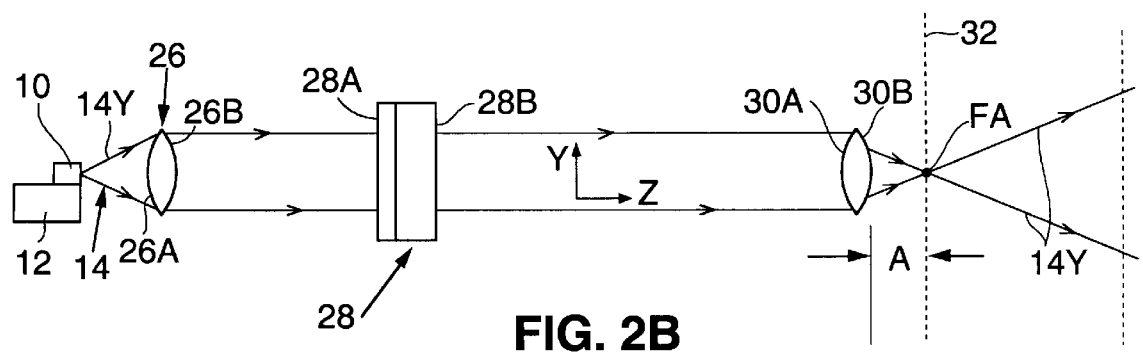

Referring now to FIG. 2A and FIG. 2B, one preferred embodiment 22 of a diode-laser line-illuminating system in accordance with the present invention includes a diode-laser 10 and an optical system 24 for shaping light-output (beam 14) of the diode-laser.

FIGS. 2A and 2B depict illumination system 22 in respectively the slow axis and fast axis thereof. Optical system 24 includes a first axially symmetric lens 26 having positive dioptric power; a cylindrical lens 28 which has positive dioptric power in the slow axis only, and a second axially symmetric lens 30 having positive dioptric power. The term axially symmetric as used herein means having the same dioptric power in both fast and slow axes. Preferably lens 30 has a longer effective focal length than that of lens 26. Lens 28 has a longer focal length than that of lens 30.

Lens 26 preferably has an effective focal length significantly greater than the largest anticipated astigmatism in diode-laser 10, for example, more than an order of magnitude greater. Lens is located at a distance about equal to its effective focal length from diode-laser 10. Lens 26 effectively collimates beam 14 in both the fast and slow axes. The term "effectively collimates" here recognizes that the astigmatism of beam 14 is not corrected by lens 26. Lens 28, in the slow axis brings the collimated beam to an intermediate focus IF between lens 28 and lens 30, while in the fast axis the beam remains collimated. Lens 30 receives a diverging beam in the slow axis and a collimated beam in the fast axis. Accordingly, light in the fast axis is brought to a sharp focus FA and light in the slow axis is brought to a focus FB further removed from exit face 30B of lens 30 than focus FA. A result of this is that in an X-Y plane (dotted line 32 in FIGS. 2A and 2B) at focus FA there is a line of light L having a width in the fast axis defined by the fast axis focal-spot size and a length in the slow axis defined by the beam width W in the slow axis at distance A from exit-face 30B of lens 30. The ratio between the beam width in the slow axis and the focal-spot size in the fast axis should be at least 20:1 and preferably 50:1.

Distances A and B of foci FA and FB respectively may be referred to as the back-focal lengths of optical system 24 in respectively the fast and slow axes. Clearly optical system 24 has a shorter back focal length in the slow axis than it has in the fast axis, i.e., the dioptric power of optical system 24 is greater in the fast axis than in the slow axis. The difference between distances A and B can be defined as the extent to which optical system 24 is astigmatic and is significantly greater than the astigmatism of beam 14 as it is emitted from aperture 16 of diode-laser 10. Preferably B is at least about two times greater than A In one example of line-illuminator 22, diode-laser 10 is a single-mode, edge-emitting diode-laser. Such a diode laser is commercially available as part number HL6720G from the Hitachi Corporation of Japan. Lens 26 is a convex-convex lens having a numerical aperture of 0.55 and an effective focal length of 4.51 millimeters (mm). Convex surface 26B of lens 26 is aspheric for reducing spherical aberration. Such a lens is commercially available as part number 350230 from Geltec, Inc. of Orlando, Fla. Convex surface 26A of lens 26 is located with its principal plane at about one focal length from aperture 16 of diode-laser 10. Lens 28 is a plano-convex cylindrical lens having an effective focal length of 50.0 mm and is located with convex surface 28A thereof at a distance of about 9.1 mm from convex surface 26B of lens 26. Lens 30 is a convex-convex lens having a numerical aperture of about 0.5 and an effective focal length of 8.0 mm. Convex surface 30 of lens 26 is also aspheric for reducing spherical aberration. Such a lens is commercially available as part number 350240 from Geltec, Inc. of Orlando, Fla. Surface 30A of lens 30 is located at a distance of 61 mm from plano surface 28B of lens 28. Line of light L in plane 32 has a width of about 3 $\mu$m across the $1/e^2$ points and a length of about 170.0 $\mu$m for an aspect ratio of greater than 50:1.

Figure 3:
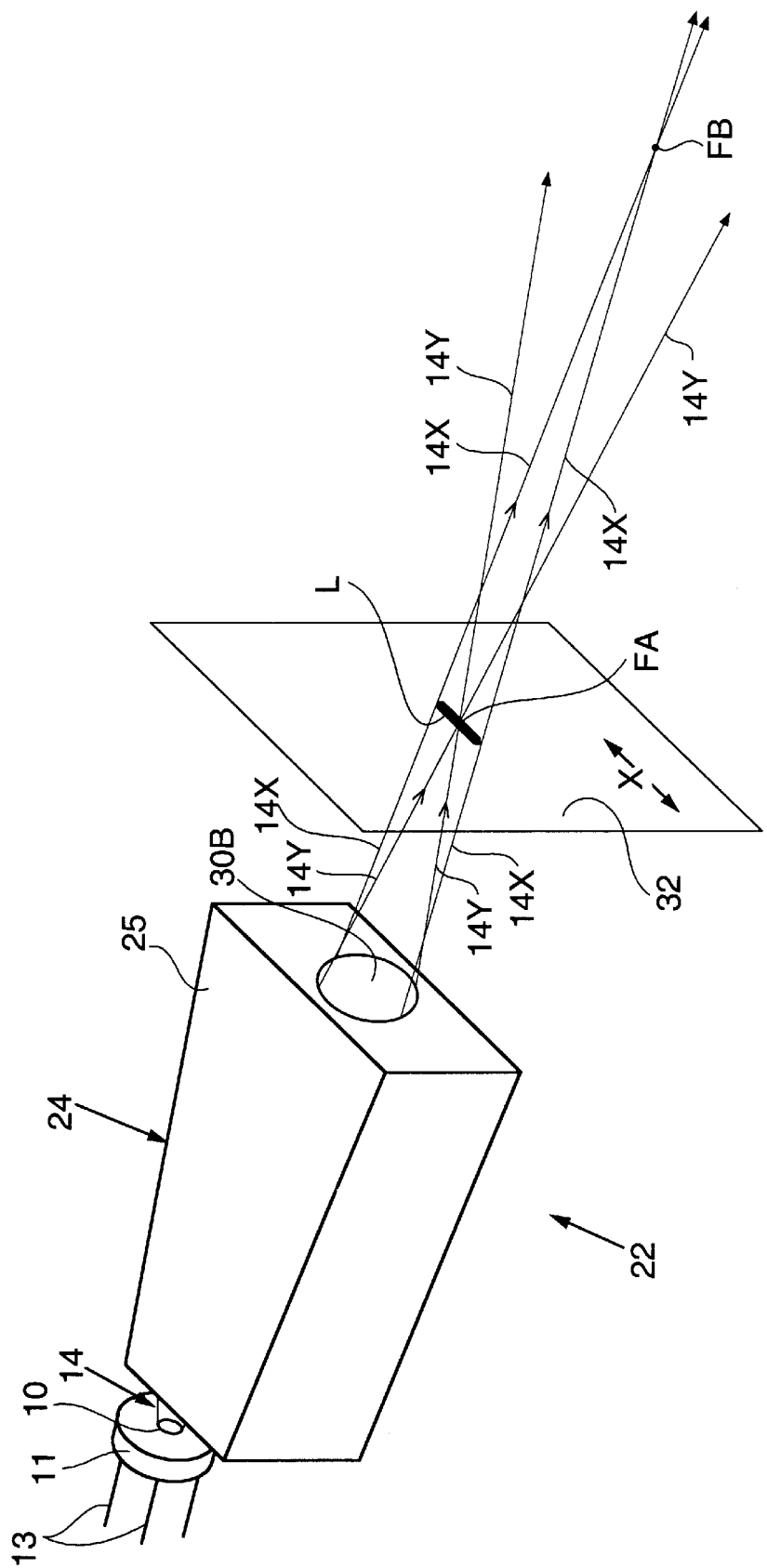
FIG. 3 schematically illustrates one preferred method of using the laser of FIGS. 2A and 2B.

In a method of using the illumination apparatus 22 an object to be illuminated is placed in plane 32 at focal point FA to be illuminated with line of light L. This is schematically depicted in FIG. 3, wherein illumination system 22 and plane 32 are illustrated in perspective form. For simplicity, optical system 24 is schematically depicted as being contained in a housing 25. First and second axis rays 14X and 14Y focussed by the optical system are illustrated as they emerge from exit face 30B of lens 30. Diode-laser 10 is schematically depicted in an arrangement wherein it is contained in a housing 11, having leads 13 extending therefrom for connecting power to the diode-laser. This arrangement is typical of commercially available diode-lasers. An object could be held stationary while being illuminated. Alternatively, an extended object could be translated through plane 32 while being illuminated. This could be done for example to illuminate a flowing liquid medium in a capillary tube or the like, or to record an extended "track" on a moving photosensitive recording medium. In such cases, motion would be in the direction of line L, i.e., in the direction of the X-axis as indicated by double arrows X.

The above described arrangement of optical system 24 relative to diode laser 10 is but one example of an optical system in accordance with the present invention. Those skilled in the art may devise other optical systems of more or less lenses or optical elements without departing from the spirit and scope of the present invention. By way of example, optical system may be shortened by using a lens having negative dioptric power as 28. Some increase in line width, however, may be experienced.

Further it should be noted that while the present invention has been described as including an edge-emitting diode-laser (semiconductor-laser) having an astigmatic light-output, principles of the invention are equally applicable to a vertical-cavity surface-emitting semiconductor-laser (VCSEL) which is known to have an essentially an astigmatic light-output.

The present invention has been described in terms of a preferred and other embodiments. The invention is not limited, however, to the embodiments described and depicted, rather the invention is limited only by the claims appended hereto.

What is claimed is:

1. An illumination apparatus, comprising:

a semiconductor-laser providing light-output in first and second mutually perpendicular axes said light-output propagating in a direction mutually perpendicular to said first and second axes;

an optical system including first, second, and third lenses spaced apart in consecutive numerical order in said direction of propagation said first and third lenses each having positive dioptric power in each of said first and second axes and said second lens having zero optical power in said first axis and positive optical power in said second axis, said optical system being arranged cooperative with said semiconductor laser such that said second lens brings said light output to an intermediate focus in said second axis only, and such that said third lens focuses said light-output in said first and second axes at respectively first and second focal-points spaced apart in said propagation direction, said first focal point being closer to said optical system than said second focal point; and wherein at a plane intersecting said first focal point perpendicular to said direction of propagation, said focused semiconductor-laser light-output is formed into a line of light having a width in said first axis and a length in said second axis.

2. The illumination apparatus of claim 1, wherein said line of light has a width less than 6.0 micrometers.

3. The illumination system of claim 2, wherein the ratio of the length of the line to the width of the line is at least 20:1.

4. An illumination apparatus, comprising:

a single-mode edge-emitting diode-laser providing light-output in mutually perpendicular fast and slow axes thereof, said light-output propagating in a direction mutually perpendicular to said fast and slow axes;

an optical system having first and second mutually perpendicular axes corresponding to said fast and slow axes and including first, second, and third lenses spaced apart in consecutive numerical order in said direction of propagation said first and third lenses each having positive dioptric power in each of said first and second axes and said second lens having zero optical power in said first axis and positive optical power in said second axis, said optical system arranged cooperative with said semiconductor laser such that said second lens brings said light output to an intermediate focus in said second axis only, and such that said third lens focuses said light-output in said first and second axes at respectively first and second focal-points spaced apart in said propagation direction, said first focal point being closer to said optical system than said second focal point; and wherein at a plane intersecting said first focal point perpendicular to said direction of propagation, said focused semiconductor-laser-light-output is formed into a line of light having a width in said fast axis and a length in said slow axis.

5. The illumination apparatus of claim 4, wherein said line of light has a width less than 6.0 micrometers.

6. An illumination apparatus, comprising:

a multimode edge-emitting diode-laser providing light-output in mutually perpendicular fast and slow axes thereof, said light-output propagating in a direction mutually perpendicular to said fast and slow axes;

an optical system having first and second mutually perpendicular axes corresponding to said fast and slow axes and including first, second, and third lenses spaced apart in consecutive numerical order in said direction of propagation said first and third lenses each having positive dioptric power in each of said first and second axes and said second lens having zero optical power in said first axis and positive optical power in said second axis, said optical system arranged cooperative with said semiconductor laser such that said second lens brings said light output to an intermediate focus in said second axis only, and such that said third lens focuses said light-output in said first and second axes at respectively first and second focal-points spaced apart in said propagation direction, said first focal point being closer to said optical system than said second focal point; and wherein at a plane intersecting said first focal point perpendicular to said direction of propagation, said focused semiconductor-laser light-output is formed into a line of light having a width in said fast axis and a length in said slow axis.

7. The illumination apparatus of claim 6, wherein said line of light has a width less than 6.0 micrometers.

8. An illumination apparatus, comprising:

a vertical-cavity surface-emitting laser providing light-output in first and second mutually perpendicular axes said light-output propagating in a direction mutually perpendicular to said first and second axes;

an optical system including first, second, and third lenses spaced apart in consecutive numerical order in said direction of propagation said first and third lenses each having positive dioptric power in each of said first and second axes and said second lens having zero optical power in said first axis and positive optical power in said second axis, said optical system arranged cooperative with said semiconductor laser such that said second lens brings said light output to an intermediate focus in said second axis only, and such that said third lens focuses said light-output in said first and second axes at respectively first and second focal-points spaced apart in said propagation direction, said first focal point being closer to said optical system than said second focal point; and wherein at a plane intersecting said first focal-point perpendicular to said direction of propagation, said focused semiconductor-laser light-output is formed into a line of light having a width in said first axis and a length in said second axis.

9. The illumination apparatus of claim 8, wherein sad line of light has a width less than 6.0 micorometers.

* * * * *